United States Patent [19]

Halstead

[11] Patent Number: 5,434,510

[45] Date of Patent: Jul. 18, 1995

[54] MINI LIGHT BULB TOOL

[76] Inventor: William Halstead, 46 Hebron Dr., Baltimore, Md. 21220

[21] Appl. No.: 154,534

[22] Filed: Nov. 19, 1993

[51] Int. Cl.⁶ ............................................. G01R 31/00
[52] U.S. Cl. ................................. 324/555; 324/512; D8/14
[58] Field of Search ............... 324/500, 508, 512, 538, 324/555, 556; D8/14

[56] References Cited

U.S. PATENT DOCUMENTS

| | | | |
|---|---|---|---|
| D. 318,996 | 8/1991 | Israelson | D8/14 |
| 2,036,077 | 3/1936 | Podell | 324/508 |
| 2,806,203 | 9/1957 | Church | 324/556 |
| 3,768,005 | 10/1973 | Louks | 324/555 |
| 5,047,721 | 9/1991 | Farley | 324/556 X |
| 5,179,339 | 1/1993 | Volk | 324/556 X |
| 5,319,312 | 6/1994 | Segilia | 324/556 |

*Primary Examiner*—Kenneth A. Wieder
*Assistant Examiner*—Glenn W. Brown
*Attorney, Agent, or Firm*—William F. Hamrock

[57] ABSTRACT

There is disclosed a dual component circuit testing and utility tool for testing defective circuits and bulbs in miniature Christmas light sets. The testing and utility tool includes a nonconductive rod having a double pronged conductive component at one end and a conductive paw component at the other end.

6 Claims, 2 Drawing Sheets

MINI LIGHT BULB TOOL

BACKGROUND OF THE INVENTION

1. Field of the Invention

The invention relates to a circuit testing and utility tool, and more particularly, to a circuit testing and utility tool for testing defective circuits and bulbs in miniature Christmas type light sets.

2. Description of the Prior art

Traditionally, miniature Christmas light sets have been used for a number of years for indoor and outdoor lighting for Christmas trees and for other decorations. Generally, the miniature light sets include a plurality of molded miniature plastic lamp sockets, having any number of lamps from thirty five to about two hundred and forty which are operated by connecting a given number of lamps in series through an end plug connected to a source of electric energy. It has been found that considerable inconvenience occurs upon failure of one of the lamps for various reasons such as, when a filament, or wires, or connectors, or bulbs break or burns out, since such failure interrupts the continuity of the circuit causing the rest of the lamps to be extinguished in many situations. When a string or plurality of series connected lamps becomes extinguished, because of such failures, it is difficult to determine which lamp is defective. In order to discover the lamp which has failed, it becomes necessary to test each lamp of the series until the defective lamp is found. This procedure involves considerable time and inconvenience and has heretofor caused considerable aggravation and discomfort in dealing with series burned out lamps.

Various methods have been proposed for avoiding the above disadvantages but none of the methods have been simple and completely successful.

SUMMARY OF THE INVENTION

It is an object of the present invention to have a device which easily and safely removes defective burned out lamp bulbs from a string of lights.

It is another object of the present invention to have a device which prevents the lamp bulbs from crashing glass or exploding in the hands of the user because of having to apply too much pressure in trying to remove the bulb from the socket.

It is a further object of the invention to have a device in determining whether there is a defective electrical connection in the string of lights without being required to remove any of the lamp bulbs from their sockets.

It is another further object of the invention to have a device having a indicator test lamp connected thereto which will indicate by means of its own lamp light whether or not the individual lamp socket or bulb base is defective.

To overcome these problems and obtain these objects, the present invention is directed to a dual component mini-light set circuit and light bulb testing and utility tool. It is a tool, simple in construction, durable, compact, lightweight, inexpensive and can be easily manufactured.

The dual component tool contains a nonconductive hollow rod having at one end a double pronged conducting fork and at the other end a conductive paw. The dual component tool can quickly remove a bulb base from its bulb socket by using the double pronged fork component and then immediately determine whether the bulb or the bulb base or the lamp socket is defective by using the conductive paw component. The double pronged fork component can also be used to determine whether the lamp socket bulb base and bulb are defective without removing the bulb and the bulb base from the lamp socket.

The double pronged conductive fork component is a U-shaped metal prong secured at one end of the nonconductive hollow rod. The double pronged conductive fork performs two functions. The first function is to remove the bulb base from the lamp socket without injuring one's hand and without having the bulb break or explode. This is accomplished by having the U-shaped prongs precisely aligned to fit into the contact point of the bulb base with the lamp socket so as to urge the bulb base out of its frictional attachment to the socket.

The second function of the fork component is to establish electrical contact within the lamp socket. This is accomplished by inserting one of the fork prongs within the slit at the bottom of the socket wherein the lead wires enter the socket. The fork prong by being inserted therein contacts the conductive lamp socket connectors within the socket to close the circuit. In this manner, it will be determined whether there is a broken wire or defective conductive attachment within the socket or lamp base and whether the bulb is defective. This test can be done without removing the bulb from the base or the base from the socket.

The conductive paw component has a conductive wire externally embedded within a nonconductive U-shaped element at the opposite end of the hollow rod. The function of the conductive paw is to complete the circuit when inserted within the lamp socket after the lamp base and bulb have been removed. The test results will show whether or not there is a defect in the lamp base or lamp socket or whether there is a defect somewhere else in the mini-light set.

DESCRIPTION OF THE PREFERRED EMBODIMENTS

Figure 1:
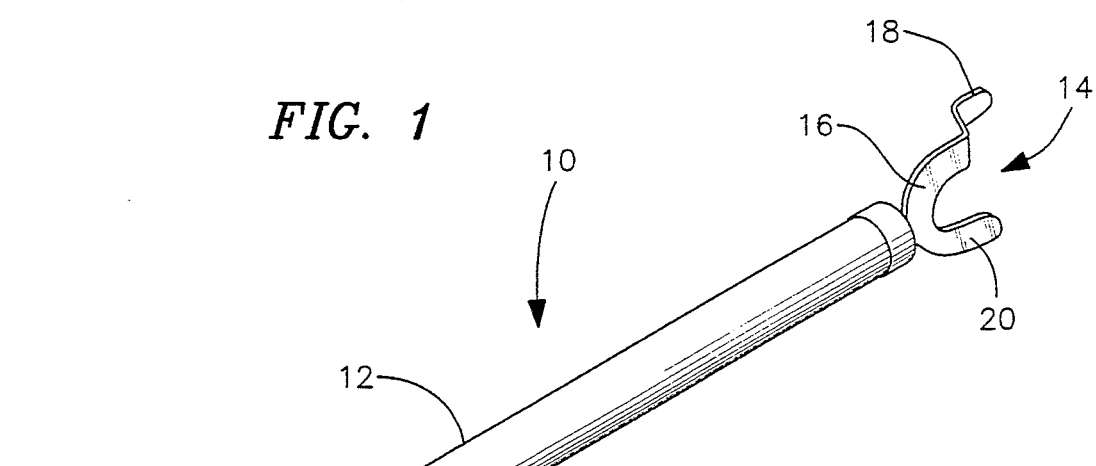
FIG. 1 is an perspective view of a preferred embodiment of the dual component mini-light set testing device of the present invention.

FIG. 1 shows a view of a preferred embodiment of the present invention illustrating the dual component mini-light testing utility tool device 10 of the invention. The device includes a nonconductive hollow rod 12 which can be plastic, rubber or other nonconductive material. At one end thereof, there is a double pronged U-shaped metal fork component 14 having a curved base 16 and metal prongs 18 and 20 extending therefrom. The metal fork component 14 is securely embedded in a nonconductive plastic or similar material secured to the hollow rod.

As shown in FIG. 1, there is a conductive paw component 22 located at the other end of the hollow rod 12. The paw component includes a conductive wire 24 externally embedded across the external surface of an inverted U-shaped paw 26 made of solid plastic or similar nonconductive material which is seated on a circular solid nonconductive base 28 secured to the hollow rod 12.

Figure 2:
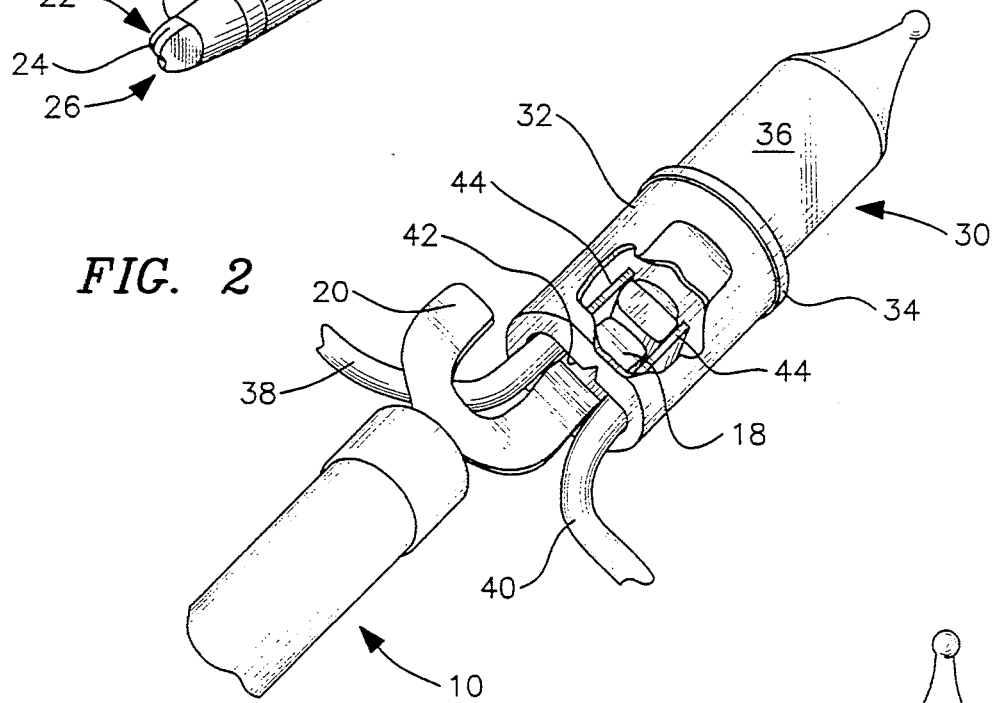
FIG. 2 is a fragmentary perspective view of a metal prong inserted into the lamp socket.

FIG. 2 is directed to show how the tool device 10 is used in conjunction with the mini-light lamp 30 which is intended to represent one lamp in a conventional string of spaced apart lamps presently on the market as mini-light sets. Each lamp 30 includes a lamp socket 32, a bulb base 34 and a bulb 36. The lamp socket 32 and bulb base 34 are generally made of molded plastic. The bulb base 34 is frictionally engaged within lamp socket 32 and the bulb 36 is frictionally engaged within the bulb base 34. Conductive lead wires 38 and 40 enter the bottom interior of lamp socket 32 through the slit 42 wherein they come in contact with separated lamp socket connectors 44, one connector being located on each side of the lamp socket interior. Conductive wires in bulb base 34 contact connectors 44 in the lamp socket while bulb 36 which is frictionally engaged in the bulb base 34 connects with conductive wires to complete the circuit and light the bulbs in the set of lights.

Returning to FIG. 1, it is seen that the metal fork component 14 has two metal prongs 18 and 20. Metal prong 18 is different from prong 20 in that it has about a ninety degree right angle step-like extension which makes prong 18 easier to be inserted within slit 42. Each of the prongs 18 and 20 is capable of being inserted within the slit 42 of the lamp socket where each prong then contacts with both lamp socket connectors 44 located on each side of the lamp socket and thereby closes the circuit. Metal prong 18 is a preferred embodiment because of its step like extension construction since then it is capable of being easily inserted within slit 42 when the lamp socket is positioned at various angles which often occurs making it more difficult to reach the lamp socket.

As seen in FIG. 2, metal prong 18 when inserted within slit 42, where lead wires 38 and 40 enter the socket, comes in contact with both of the socket connectors 44 located at each side of the lamp socket and thereby closes the circuit within the lamp socket at this point. This means that the circuit in the mini-lamp 30 is completed in the lamp socket without proceeding through the bulb base 34 and bulb 36. This test can be conducted with or without the bulb being in the bulb base or whether the bulb base being tested is in the lamp socket that is being tested. This test will determine the following for each lamp being tested.

When the problem is that:

1. The light bulbs do not light up while the mini-light set is plugged in but when tested with prong 20 inserted in slit 42.

Result (a) The light bulbs light up except for the bulb being tested, then either this bulb or bulb base is defective but the remainder of the mini-light set is working.

Result (b) The remaining bulbs in the set do not light up when the test is being conducted, then the lamp being tested is probably not the source of the problem if there is only one defect in the circuit and if that defect is not a defective lead wire 38 or 40 or defective socket connector 44 within the lamp socket being connected.

Figure 3:
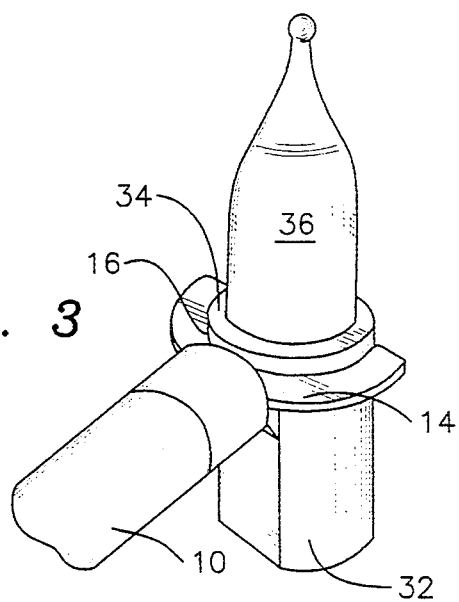
FIG. 3 is a fragmentary perspective view of the metal fork showing the bulb base with the bulb being removed from the lamp socket.

FIG. 3 is directed to an improved embodiment of the invention by solving the problem of removing the bulb base 34 and bulb 36 from the lamp socket 32. Removing the bulb base and bulb from the lamp socket has always been a problem encountered by people using mini-light sets because of the inconvenience and discomfort of grasping and removing the light elements without breaking the fragile bulb and injuring one's fingers or hands. The present invention overcomes these difficulties by using the metal fork component 14 to remove the bulb base containing the bulb from the socket. Seen in FIG. 3 is how the metal fork component 14 performs its utility function of the invention and how the curbed base 16 of the fork component fits within the contact point of the bulb base 34 and lamp socket 32 to easily urge the bulb base from its frictional attachment. The bulb 36 can then be removed easily from the bulb base 34 without any problem.

Figure 4:
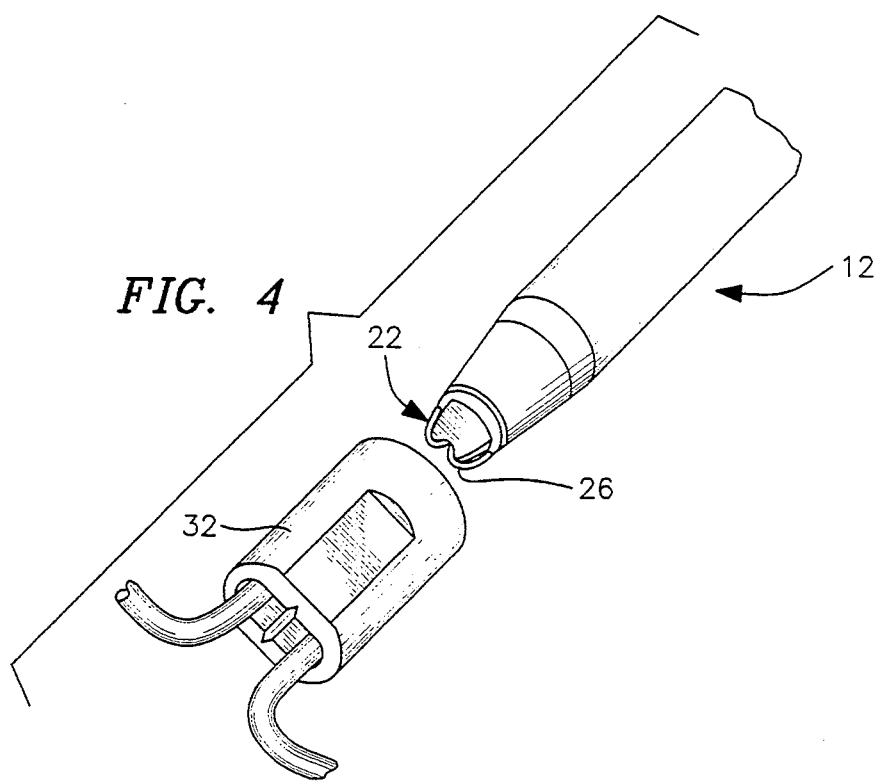
FIG. 4 is an exploded fragmentary perspective view of the conductive paw in combination with the lamp socket.

Shown in FIG. 4 is another preferred embodiment of the invention directed to how the paw component 22 which is located at the other end of the hollow rod 12 is used to test for the cause of trouble in a mini-light set that does not light up when plugged in. It is a simple test in that all that is required is to remove the bulb base 34 with the fork component 14 from the lamp socket 32 and then insert the metal paw component 22 into the lamp socket 32. The contour of the U-shaped paw 26 is precisely configured to fit within the interior of the lamp socket 32. Thus, the conductive wire 24 of the U-shaped paw 26 is then in contact with the side connectors 44 of the lamp socket which closes the circuit within the remainder of the mini-light set.

The test conducted with the paw component 22 will solve the same problems as described above when using a metal prong 18 or 20. The test with the paw component will determine whether the bulb or bulb base is defective if the remainder of the mini-light set lights up after the U-shaped paw 26 is inserted into the lamp socket. This test will also determine, if the light set does not light up, then that bulb base or bulb is not the problem if only one defect exists in the light set circuit and if that defect is not a defective lead wire 38 or 40 or defective socket connector 44 in the lamp socket being tested.

Figure 5:
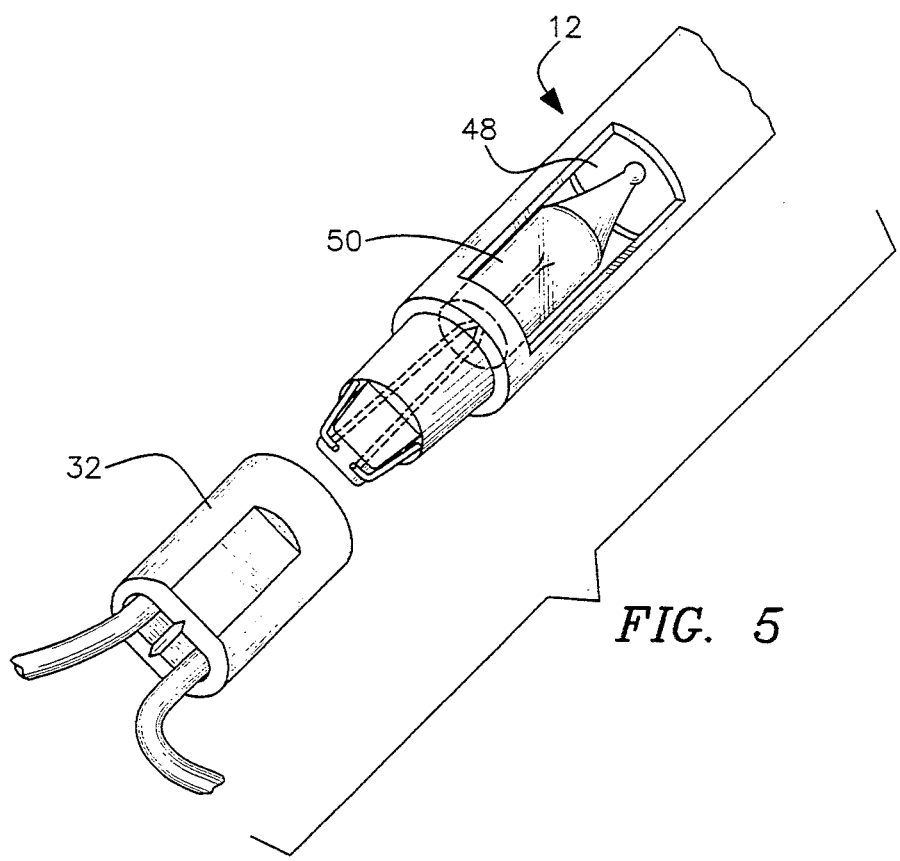
FIG. 5 is an exploded fragmentary perspective view of a preferred embodiment illustrating a test bulb indicator.

Referring to FIG. 5, there is shown another preferred embodiment of the invention. In this embodiment, the paw component 22 is conductively connected to a test bulb 50 which is located within the hollow rod 12 and is seen through opening 48 in the hollow rod. Also, the paw component with its attached bulb can actually be similar to a bulb base 34 with its bulb 36 frictionally engaged therein and then having this secured within the hollow rod 12. In other words, the test bulb 50 can be very similar to a standard bulb 36 frictionally engaged in a standard bulb base 34 and that bulb device secured within the hollow rod.

The test conducted with this paw component, that is test bulb 50, will solve the same problems as previously described with paw component 32 and when using the metal prongs 18 or 20. The test bulb 50 will complete the circuit and light up itself when the paw component is fitted into the lamp socket 32 if the remainder of the mini-light set is not defective and lights up as well. If the test bulb 50 and the remainder of the mini-light set do not light up then there is a problem elsewhere in the circuit as previously described.

It will be understood by those skilled in the art that the dual component mini-light testing and utility device of this invention is a novel and efficient device that performs many functions with one small unit. There are testing devices at each end of the hollow rod which will quickly determine whether the mini-light set is defective and in addition to the effective use of the utility fork component 14 which will quickly remove the bulb base from the lamp socket without injuring one's fingers. Test bulb 50 is an added simple test feature. Applicant is not aware of any device that performs so many functions with one simple, inexpensive device which is easy to use.

It will be understood by those skilled in the art that various modifications may be made without departing from the spirit and scope of the invention.

Parts List 10. dual component mini-light testing and utility device 12. hollow rod 14. metal fork component 16. curved base 18. metal prong with extension 20. metal prong 22. paw component 24. conductive wire 26. U-shaped paw 28. nonconductive base 30. mini-lamp 32. lamp socket 34. bulb base 36. bulb 38. lead wire 40. lead wire 42. slit 44. side connectors 48. opening for test bulb 50. test bulb

What is claimed is:

1. A dual testing and utility tool for conventional mini light decorative sets including a plurality of miniature lamps, each lamp containing a lamp socket with bulb base frictionally engaged therein with a bulb frictionally engaged in the bulb base, and lead wires entering through a slit opening in the bottom of the lamp socket connecting with conductive connectors therein, said tool comprising in combination, a nonconductive rod terminating in first and second functional elements, the first functional element including a lamp testing and removing device having two spaced apart conductive prong members connected in continuous conductive relation with an arcuate shaped base member, either of said prong members being inserted into said slit and in contact with said conductive connectors therein and the second functional element including a second lamp testing device.

2. A dual testing and utility tool according to claim 1 wherein one of said prong members includes a conductive terminal step-like extension member.

3. A dual testing and utility tool according to claim 2 wherein said base member is utilized to remove said bulb base from said lamp socket.

4. A dual testing and utility tool according to claim 3 wherein said second lamp testing device includes a conductive wire externally embedded in a nonconductive inverted U-shaped element which is inserted into said lamp socket to contact said conductive connectors.

5. A dual testing and utility tool according to claim 4 wherein said nonconductive rod has a hollow interior.

6. A dual testing and utility tool according to claim 5 wherein said second lamp testing device is in conductive contact with a light bulb located within the hollow interior of the nonconductive rod having openings therein.

* * * * *